(12) United States Patent
Müller

(10) Patent No.: US 6,560,149 B2
(45) Date of Patent: May 6, 2003

(54) INTEGRATED SEMICONDUCTOR MEMORY DEVICE

(75) Inventor: Jochen Müller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/084,134

(22) Filed: Feb. 27, 2002

(65) Prior Publication Data

US 2002/0118586 A1 Aug. 29, 2002

(30) Foreign Application Priority Data

Feb. 27, 2001 (DE) .......................................... 101 09 335

(51) Int. Cl.$^7$ ................................................. G11C 7/00
(52) U.S. Cl. ..................... 365/200; 365/201; 365/225.7
(58) Field of Search .................................. 365/200, 201, 365/225.7, 230.06, 215, 234; 714/711, 718

(56) References Cited

U.S. PATENT DOCUMENTS

| | | | |
|---|---|---|---|
| 5,987,632 A | | 11/1999 | Irrinki et al. ................ 714/711 |
| 6,064,609 A | * | 5/2000 | Jung et al. ................... 365/200 |
| 6,081,910 A | | 6/2000 | Mifsud et al. ............... 714/718 |
| 6,154,389 A | * | 11/2000 | Chung et al. ........... 365/185.09 |
| 6,191,984 B1 | * | 2/2001 | Noh ............................ 365/200 |

\* cited by examiner

*Primary Examiner*—David Lam
(74) *Attorney, Agent, or Firm*—Laurence A. Greenber; Werner H. Stemer; Ralph E. Locher

(57) ABSTRACT

An integrated semiconductor memory device that can be subjected to a memory cell test in order to determine functional and defective memory cells includes addressable normal memory cells, a first redundancy unit having first addressable redundant memory cells and optically programmable switches for replacing an address of a defective normal memory cell by the address of a first redundant memory cell, and a second redundancy unit having second addressable redundant memory cells and electrically programmable switches for replacing an address of a defective normal memory cell by the address of a second redundant memory cell. The second redundancy unit can be connected by the activation of an irreversibly programmable switch, which enables a simplified functional test at the wafer level.

11 Claims, 1 Drawing Sheet

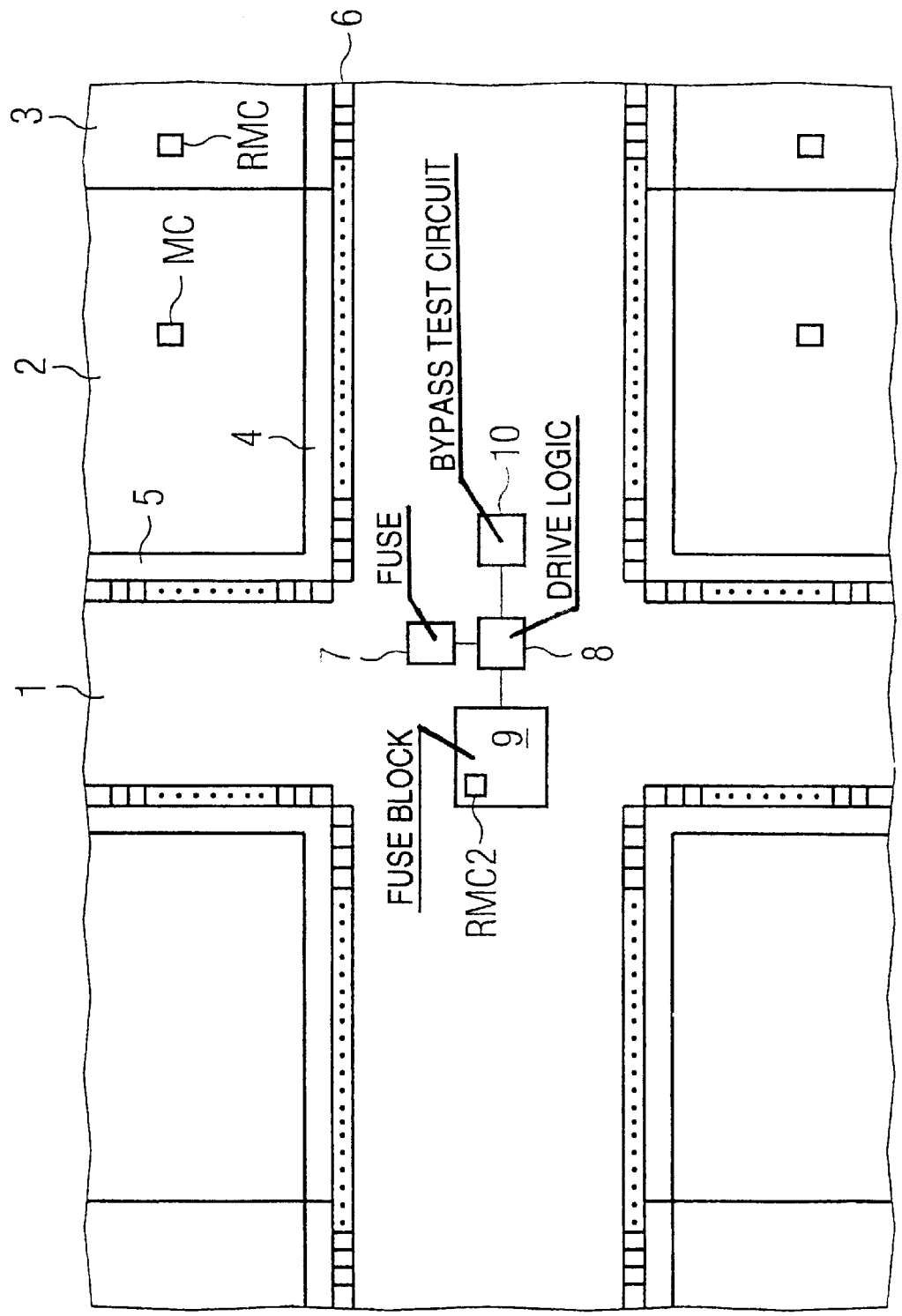

INTEGRATED SEMICONDUCTOR MEMORY DEVICE

BACKGROUND OF THE INVENTION

FIELD OF THE INVENTION

The invention relates to an integrated semiconductor memory device that can be subjected to a memory cell test in order to determine functional and defective memory cells, having addressable normal memory cells, a first redundancy unit having first addressable redundant memory cells and optically programmable switches for replacing an address of a defective normal memory cell by the address of a first redundant memory cell, and a second redundancy unit having second addressable redundant memory cells and electrically programmable switches for replacing an address of a defective normal memory cell by the address of a second redundant memory cell.

To repair defective memory cells, integrated semiconductor memories generally have redundant memory cells, which are usually combined to form redundant row lines and redundant column lines that can replace, in address terms, the regular lines with defective memory cells.

In such a case, for example, an external test device or a self-test device tests the integrated memory is tested and programming of the redundant elements is subsequently performed based upon a so-called redundancy analysis. A redundancy circuit then has programmable elements, for example, in the form of programmable fuses, which serve for replacing the address of a defective cell, row line, or column line by a defect-free redundant cell, row line, or column line.

Programmable switches that, in the event of programming, are brought from a conducting (low-impedance) to a non-conducting (high-impedance) state (so-called fuses) and programmable switches that, in the event of programming, are changed from a high-impedance to a low-impedance state (so-called anti-fuses) are both customary.

The programming of the fuses is a one-off, irreversible operation by which the programmable switch is brought permanently to the desired state. In such a case, the programming can be effected by applying a laser pulse or an electrical voltage or current pulse to the programmable switch. The term laser fuses is used in the former case and the term e-fuses in the latter case.

The prior art includes providing two separate redundancy units in an integrated semiconductor memory. In such a case, a first redundancy unit usually has a large number of redundant memory cells whose addresses can replace the addresses of defective normal memory cells through the programming of laser fuses. These memory cells are used to repair the memory at the wafer level, where the laser fuses are still accessible to the laser beam without any difficulty.

Once the memory modules are housed, the laser fuses are no longer accessible to a laser beam. Nevertheless, in order to be able to repair memory cell defects that occur during later tests on housed modules, in such a concept a very limited number of redundant memory cells are provided, which can be activated by electrical fuses. A repair using e-fuses does not take place at the wafer level because a large number of laser fuses are still present here.

In the case of this redundancy concept, the problem arises that the electrical fuses and their drive circuits, during the tests at the wafer level, during which their functionality is not yet required, can nevertheless have repercussions on the function of other components of the semiconductor memory, which makes it more difficult to test for the functionality of these components or can even make it impossible to perform the test in the case of defective e-fuse drive circuits.

Furthermore, the electrical fuses and the logic required for their driving and programming cause additional production complexity and, hence, additional costs. These factors become superfluous if a production process or the test technique for a specific memory configuration has settled so well that only very few defects occur at the module level.

If the electrical fuses are completely omitted, that is to say, the corresponding process steps are left out during production, short circuits then result on the module instead of unblown anti-fuses with high resistance, which short circuits would be interpreted incorrectly as blown fuses during the read-out of the anti-fuses. Consequently, such a procedure does not constitute a practicable method.

One solution lies in using a separate mask for the processing, in which the logic for the repair for the electrical fuses is generally switched off. However, this solution requires an additional mask.

U.S. Pat. No. 6,081,910 to Mifsud et al. discloses an integrated semiconductor memory device having a redundancy unit that can be programmed in two passes by permanently programmable switches for the replacement of defective memory cells. In such a case, at least the permanently programmable switches can be electrically programmable for the second pass, which makes it possible to perform the second pass on housed modules as well. U.S. Pat. No. 5,987,632 to Irrinki et al. also describes an integrated semiconductor memory device having a redundancy unit that can be programmed in two passes for the replacement of defective memory cells. In such a case, defective memory cells are replaced by redundant memory cells only in the second pass, while the first pass serves for definitely disconnecting defective memory cells.

SUMMARY OF THE INVENTION

It is accordingly an object of the invention to provide an integrated semiconductor memory device that overcomes the hereinafore-mentioned disadvantages of the heretofore-known devices of this general type and that does not have the second redundancy unit with its electrically programmable switches adversely affect the tests for functionality of the other components of the semiconductor memory at the wafer level.

With the foregoing and other objects in view, there is provided, in accordance with the invention, an integrated semiconductor memory device to be subjected to a memory cell test for determining functional and defective memory cells including addressable memory cells, a first redundancy unit having first addressable redundant memory cells and optically programmable switches for replacing an address of a defective one of the memory cells by an address of one of the first redundant memory cells, a second redundancy unit having second addressable redundant memory cells and electrically programmable switches for replacing an address of a defective one of the memory cells by an address of one of the second redundant memory cells, and an irreversibly programmable switch connected to the second redundancy unit for activating the second redundancy unit.

According to the invention, the second redundancy unit of the integrated semiconductor memory device can be connected by the activation of an irreversibly programmable switch. What the configuration makes possible is that, during the tests at the wafer level, the repair of memory cells by electrically programmable switches is generally still disconnected. Only at the end of the wafer test is a decision taken as to whether or not the second redundancy unit is connected by activation of the irreversibly programmable switch.

If the second redundancy unit is connected at the end of the tests at the wafer level, then defective memory cells can be repaired subsequently at the module level in a conventional manner with the aid of the electrically programmable switches.

However, it is also possible for the second redundancy unit also not to be connected at the end of the wafer test and, thus, for the repair at the module level to be generally left switched off. This is advantageous, for example, when the production process has settled so well that the number of defects at the module level is so small that it is not worth the outlay for the provision and repair by electrically programmable switches. In such a case, it is possible to dispense with repair at the module level, and, by the same token, save the additional costs for the processing of the electrically programmable switches and the drive logic required for these switches.

In accordance with another feature of the invention, the integrated semiconductor memory device expediently has a bypass test circuit, through which the second redundancy unit is accessible for testing even without activation of the irreversibly programmable switch. It is, thus, possible to test the functionality of the second redundancy unit at the wafer level, without taking a final decision about the connection of the redundancy unit.

In accordance with a further feature of the invention, the irreversibly programmable switch may be formed, for instance, by a laser fuse or an e-fuse; at present, a configuration with a laser fuse is preferred because the latter can be activated at the end of the tests at the wafer level without an additional outlay.

In accordance with an added feature of the invention, advantageously, the number of second redundant memory cells is significantly smaller than the number of first redundant memory cells. The ratio makes it possible to fully exhaust the repair possibilities at the wafer level and to replace only a small number of memory cells additionally at the module level with the electrically programmable switches.

The number of first and second redundant memory cells generally depends on the size of the memory device, that is to say, the number of normal memory cells. The number of first redundant memory cells is preferably between 1% and 10%, in particular, between 2% and 5%, of the number of normal memory cells. The number of second redundant memory cells is significantly smaller, and amounts, for example, to a few hundred memory cells. The number of second memory cells is advantageously coordinated with the organization structure of the memory module.

In accordance with an additional feature of the invention, the first redundant memory cells adjoin the normal memory cells, and the second redundant memory cells are disposed at a distance from the normal memory cells.

In accordance with yet another feature of the invention, the optically programmable switches are preferably configured as laser fuses, that is to say, are irreversibly programmable by a laser pulse.

Equally, in accordance with a concomitant feature of the invention, it is preferred for the electrically programmable switches to be formed by e-fuses, that is to say, to be irreversibly programmable by an electrical pulse, for instance, a voltage or current pulse.

Other features that are considered as characteristic for the invention are set forth in the appended claims.

Although the invention is illustrated and described herein as embodied in an integrated semiconductor memory device, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a fragmentary, plan view of an unhoused memory module according to the invention.

DESCRIPTION OF THE PREFERRED EMBODIMENTS

Referring now to the figures of the drawings in detail and first, particularly to FIG. 1 thereof, there is shown an unhoused memory module 1 having a memory cell array 2, which is organized in matrix form in a conventional manner and has regular row and column lines at whose crossover points memory cells MC are disposed. Only the elements necessary for understanding the invention are illustrated in the FIGURE.

Disposed in a manner adjoining each memory cell array 2 is a redundant memory cell array 3, whose memory cells RMC are accessible in the same way through row lines and column lines. The memory cells MC and RMC each include a selection transistor, which can be turned on by the activation of a row line, and a storage capacitor, which can store an information bit in the form of charge and output it again.

To be able to access a specific memory cell by specifying an address, address decoders 4, 5 for rows and columns are furthermore provided.

The memory cells RM of the memory cell array 2 are firstly checked for functionality by tests at the wafer level. Defective cells are firstly registered and then replaced, in address terms, by functional, redundant memory cells RMC through programming of laser fuses 6 organized in a laser fuse bank. It is generally the case that an individual memory cell MC is not replaced, rather, an entire row line or column line containing defective memory cells is replaced by an intact redundant row line or column line.

After the conclusion of the tests at the wafer level and the packaging of the memory modules, the laser fuses 6 are no longer accessible. Therefore, over and above the redundant memory cell block 3, a limited number of further redundant memory cells RMC2 are additionally provided to be able to correct defects that are only identified during the subsequent tests at the module level.

The redundant memory cells RMC2 are disposed in an e-fuse block 9 together with a series of electrically programmable fuses (e-fuses). The redundant memory cells RMC2 and the electrically programmable fuses are driven by a drive logic 8.

The number of redundant memory cells RMC depends on the size of the memory module. By way of example, a 64 Mbit chip has a first redundancy 3 of 2 Mbits. The second redundant memory cells RMC2 serve as intended for replacing a few cells. However, it is expedient, in the case of a failure at an address, to be able to replace all the data lines associated with the address. In the case of a chip with a ×16 organization, there are 16 cells, for example, for an address. In order then to obtain a repair capability of 16 defect addresses, the number of second redundant memory cells amounts to 16×16=256.

Furthermore, a laser fuse 7 is provided, through which the entire redundancy unit including the redundant memory cells RMC2 and the e-fuses can be connected. The laser fuse 7 is not yet blown during the tests at the wafer level, so that the entire redundancy unit is initially disconnected and cannot influence the functional test of the remaining components.

Only at the end of the wafer test is a decision taken as to whether or not the functionality of the e-fuse block is required for further repairs at the module level. If the functionality is required, a laser pulse blows the laser fuse 7 and the e-fuse block 9 is, thus, activated.

If the laser fuse 7 is not blown, the e-fuse block remains inactive in the further course of events. It is, therefore, possible, in the case of a well-settled production process, from the outset to dispense with the processing of the e-fuses, and to leave the e-fuse block 9 disconnected after the end of the wafer tests. Such a configuration makes it possible to avoid the situation in which on-chip circuits that are initialized upon the start-up of the external supply voltage and, in the process, interrogate the fuses as to whether or not they are intact or blown incorrectly interpret non-processed e-fuses as blown fuses.

To be able to test the functionality of the e-fuse block 9 itself, without having to blow the laser fuse 7, and, thus, to take a final decision about the connection, a bypass test circuit 10 is furthermore provided, through which the e-fuse block 9 and the drive circuit 8 are accessible for test purposes. In such a case, a test mode that makes the functionality of the e-fuse block 9 accessible can be activated both at the wafer level and at the module level.

I claim:

1. An integrated semiconductor memory device to be subjected to a memory cell test for determining functional and defective memory cells, comprising:
    addressable memory cells;
    a first redundancy unit having:
        first addressable redundant memory cells; and
        optically programmable switches for replacing an address of a defective one of said memory cells by an address of one of said first redundant memory cells;
    a second redundancy unit having:
        second addressable redundant memory cells; and
        electrically programmable switches for replacing an address of a defective one of said memory cells by an address of one of said second redundant memory cells; and
    an irreversibly programmable switch connected to said second redundancy unit for activating said second redundancy unit.

2. The integrated semiconductor memory device according to claim 1, including a bypass test circuit, said second redundancy unit being accessible for testing without activation of said irreversibly programmable switch through said bypass test circuit.

3. The integrated semiconductor memory device according to claim 1, wherein a number of said second redundant memory cells is substantially smaller than a number of said first redundant memory cells.

4. The integrated semiconductor memory device according to claim 1, wherein a number of said second redundant memory cells is smaller than a number of said first redundant memory cells.

5. The integrated semiconductor memory device according to claim 1, wherein:
    said first redundant memory cells adjoin said memory cells; and
    said second redundant memory cells are disposed at a distance from said memory cells.

6. The integrated semiconductor memory device according to claim 1, wherein:
    said first redundant memory cells are adjacent said memory cells; and
    said second redundant memory cells are disposed at a distance from said memory cells.

7. The integrated semiconductor memory device according to claim 1, wherein said irreversibly programmable switch is a laser fuse.

8. The integrated semiconductor memory device according to claim 1, wherein said optically programmable switches include laser fuses.

9. The integrated semiconductor memory device according to claim 1, wherein each of said optically programmable switches is a laser fuse.

10. The integrated semiconductor memory device according to claim 1, wherein said electrically programmable switches are irreversibly programmable by one of the group consisting of an electrical current and a voltage pulse.

11. An integrated semiconductor memory device to be subjected to a memory cell test for determining functional and defective memory cells, comprising:
    addressable memory cells each with an address;
    a first redundancy unit having:
        first addressable redundant memory cells each with an address; and
        optically programmable switches for replacing an address of a defective one of said memory cells by an address of one of said first redundant memory cells;
    said first redundancy unit connected to said addressable memory cells;
    a second redundancy unit having:
        second addressable redundant memory cells each with an address; and
        electrically programmable switches for replacing an address of a defective one of said memory cells by an address of one of said second redundant memory cells;
    an irreversibly programmable switch connected to said second redundancy unit for activating said second redundancy unit and connecting said second redundancy unit to said addressable memory cells.

* * * * *